(12) United States Patent
Kim

(10) Patent No.: US 7,589,011 B2
(45) Date of Patent: Sep. 15, 2009

(54) SEMICONDUCTOR DEVICE AND METHOD OF FORMING INTERMETAL DIELECTRIC LAYER

(75) Inventor: Byung Ho Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 192 days.

(21) Appl. No.: 11/616,791

(22) Filed: Dec. 27, 2006

(65) Prior Publication Data
US 2007/0145589 A1 Jun. 28, 2007

(30) Foreign Application Priority Data
Dec. 28, 2005 (KR) .................. 10-2005-0132079

(51) Int. Cl.
*H01L 21/4763* (2006.01)

(52) U.S. Cl. .................. 438/618; 438/622; 438/637; 257/758; 257/774; 257/E21.575

(58) Field of Classification Search .................. 438/18, 438/622, 623, 629, 637, 642; 257/758, 774, 257/775, E21.575–E21.596
See application file for complete search history.

(56) References Cited

U.S. PATENT DOCUMENTS

| | | | |
|---|---|---|---|
| 2002/0068441 A1* | 6/2002 | Lin | 438/637 |
| 2003/0062625 A1* | 4/2003 | Anand | 257/758 |
| 2005/0280120 A1* | 12/2005 | Tomita | 257/620 |
| 2007/0108573 A1* | 5/2007 | Chung et al. | 257/678 |

* cited by examiner

*Primary Examiner*—Ha Tran T Nguyen
*Assistant Examiner*—Daniel Whalen
(74) *Attorney, Agent, or Firm*—Sherr & Vaughn, PLLC

(57) ABSTRACT

There is provided a semiconductor device in which extension units are formed in the ends of a slit that constitutes a slit pattern to relieve stress transmitted between interconnect layers. The embodiments relate to a semiconductor device which includes a first metal layer included on a semiconductor substrate, an interlayer dielectric layer having a low dielectric constant and being formed on the first metal layer, via patterns formed on the interlayer dielectric layer, a second metal layer formed on the interlayer dielectric layer having the low dielectric constant, and slit patterns formed immediately above regions of the second metal layer where the via patterns of the interlayer dielectric layer are not formed, wherein extension units are formed at an end of a slit that constitutes a slit pattern.

11 Claims, 4 Drawing Sheets

SEMICONDUCTOR DEVICE AND METHOD OF FORMING INTERMETAL DIELECTRIC LAYER

The present application claims priority under 35 U.S.C. 119 and 35 U.S.C. 365 to Korean Patent Application No. 10-2005-0132079 (filed on Dec. 28, 2005), which is hereby incorporated by reference in its entirety.

BACKGROUND

As semiconductor devices have become more highly integrated, the distance between interconnections is reduced. Due to the high dielectric constant of the material used for insulating interconnections from each other, parasitic capacitance between the interconnections is increased, causing signal delays, and degrading the characteristics of the device.

As the size of semiconductor devices is reduced, the thickness of the inter metal dielectric (IMD) layer for separating metals from each other is reduced. As a result, interference and cross-talk occurs between upper and lower metal layers.

When the interlayer dielectric layer has a high dielectric constant, a larger parasitic capacitance is formed between the IMD layer and the upper and lower metal layers. For this reason, various new materials and new processing methods have been studied to reduce the dielectric constant between the metal layers.

Also, as semiconductor devices have become more highly integrated, even the vias that connect metal interconnections are also more tightly integrated. Therefore, the defects of the semiconductor device increase, which becomes a critical matter to be solved in the process of manufacturing the semiconductor device.

When the metal layers are positioned on the integrated vias, during a subsequent thermal process, the moisture included in the vias is evaporated and causes stress to the metal layers and thus generates problems such as voids or blisters in the metal layers.

SUMMARY

Embodiments relate to a method of forming slits in metal layers to reduce defects in an inter metal dielectric layer of a low dielectric constant. Embodiments relate to slit patterns in metal layers positioned over an interlayer dielectric layer where integrated vias are formed to effectively remove the stress transmitted to the metal layers.

Embodiments relate to a semiconductor device which includes a first metal layer included on a semiconductor substrate, an interlayer dielectric layer having a low dielectric constant and being formed on the first metal layer, via patterns formed on the interlayer dielectric layer, a second metal layer formed on the interlayer dielectric layer having the low dielectric constant, and slit patterns formed immediately above regions of the second metal layer where the via patterns of the interlayer dielectric layer are not formed, wherein extension units are formed at an end of a slit that constitutes a slit pattern.

The extension units may be formed at both ends of the slit, respectively.

The extension units may have square or circular shapes when viewed in a plan view.

A plurality of via patterns are grouped in a form of a square matrix.

The slits may be positioned between groups of the via patterns.

The second metal layer may be a power source interconnection.

Embodiments relate to a method of manufacturing a semiconductor device, the method including forming a first metal layer on a semiconductor substrate, forming an interlayer dielectric layer having a low dielectric constant on the first metal layer, forming via patterns on the interlayer dielectric layer, forming a second metal layer on the interlayer dielectric layer, and forming slit patterns including extension units at ends thereof immediately above regions of the second metal layer where the via patterns of the interlayer dielectric layer are not formed.

BRIEF DESCRIPTION OF DRAWINGS

Example

Example

Example

DETAILED DESCRIPTION

Figure 1:
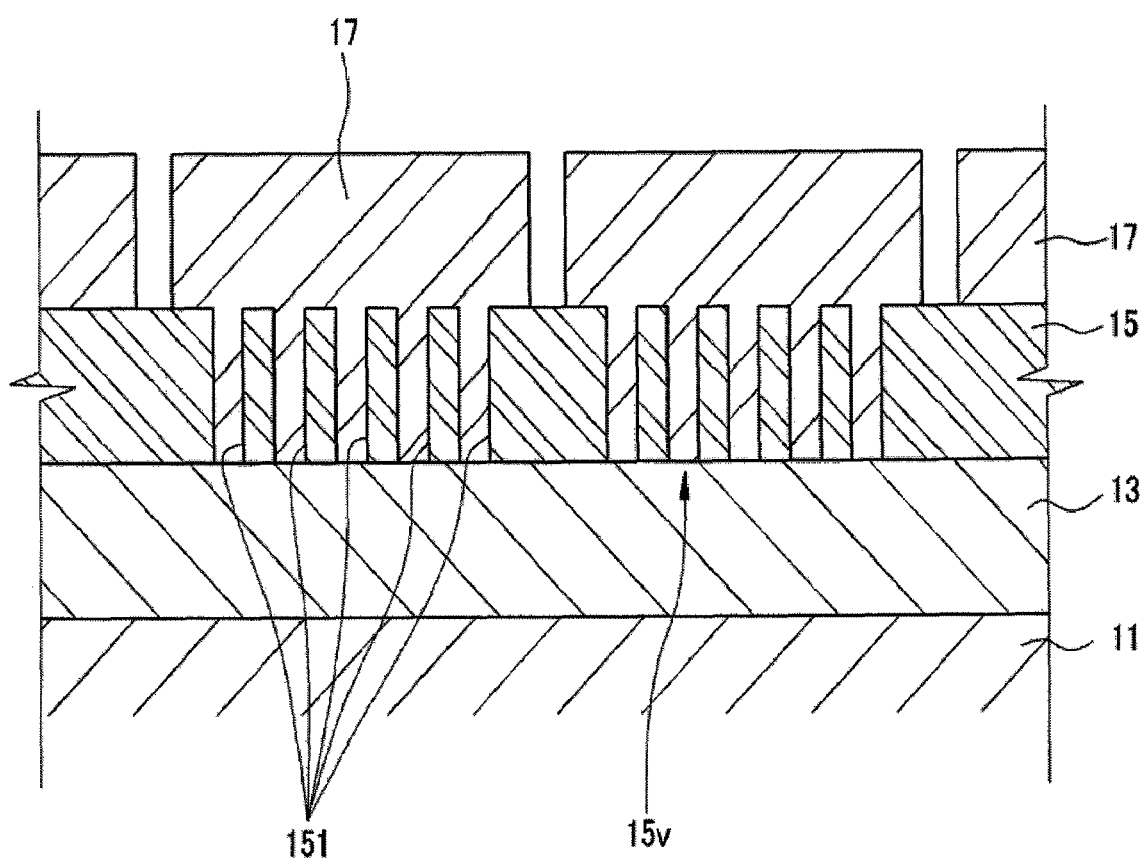
FIG. 1 is a sectional view illustrating a semiconductor device according to embodiments.
Figure 2:
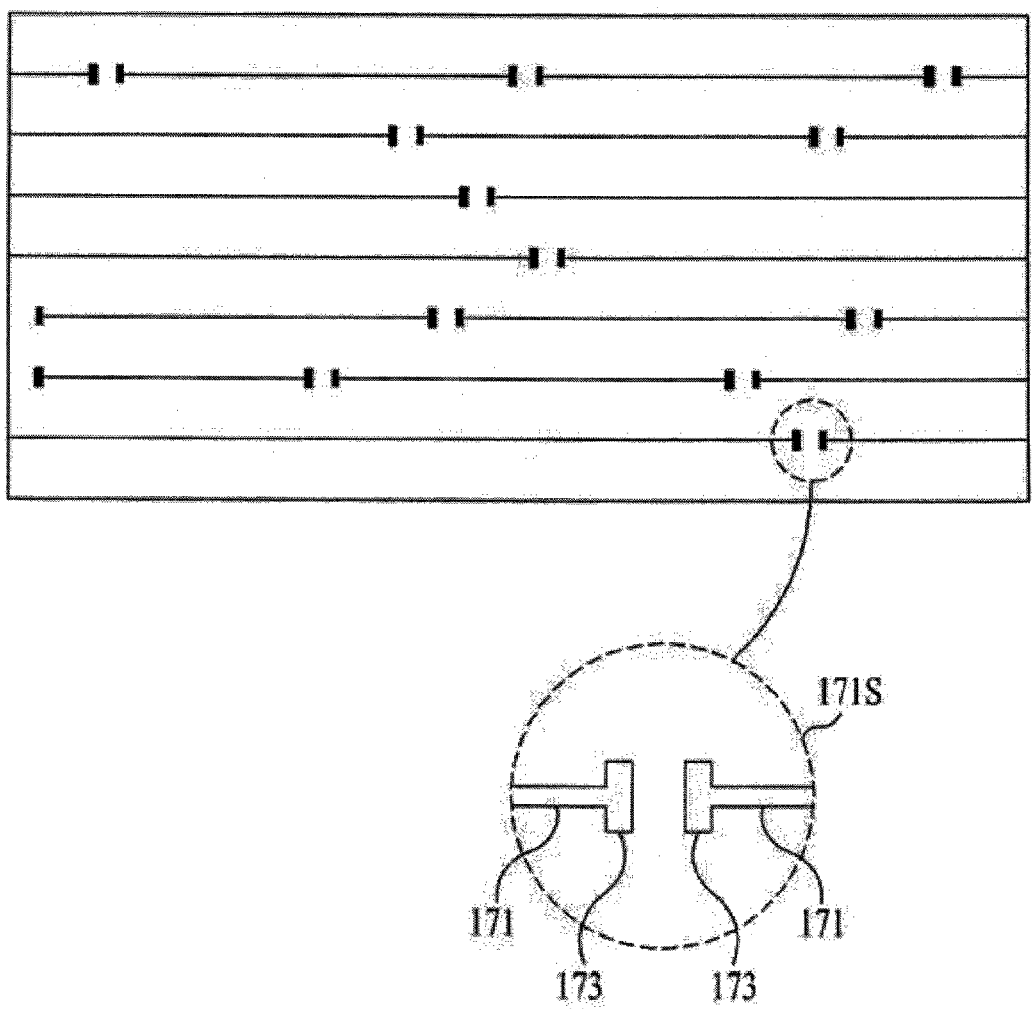
FIG. 2 illustrates slit patterns formed in an upper metal layer.
Figure 4:
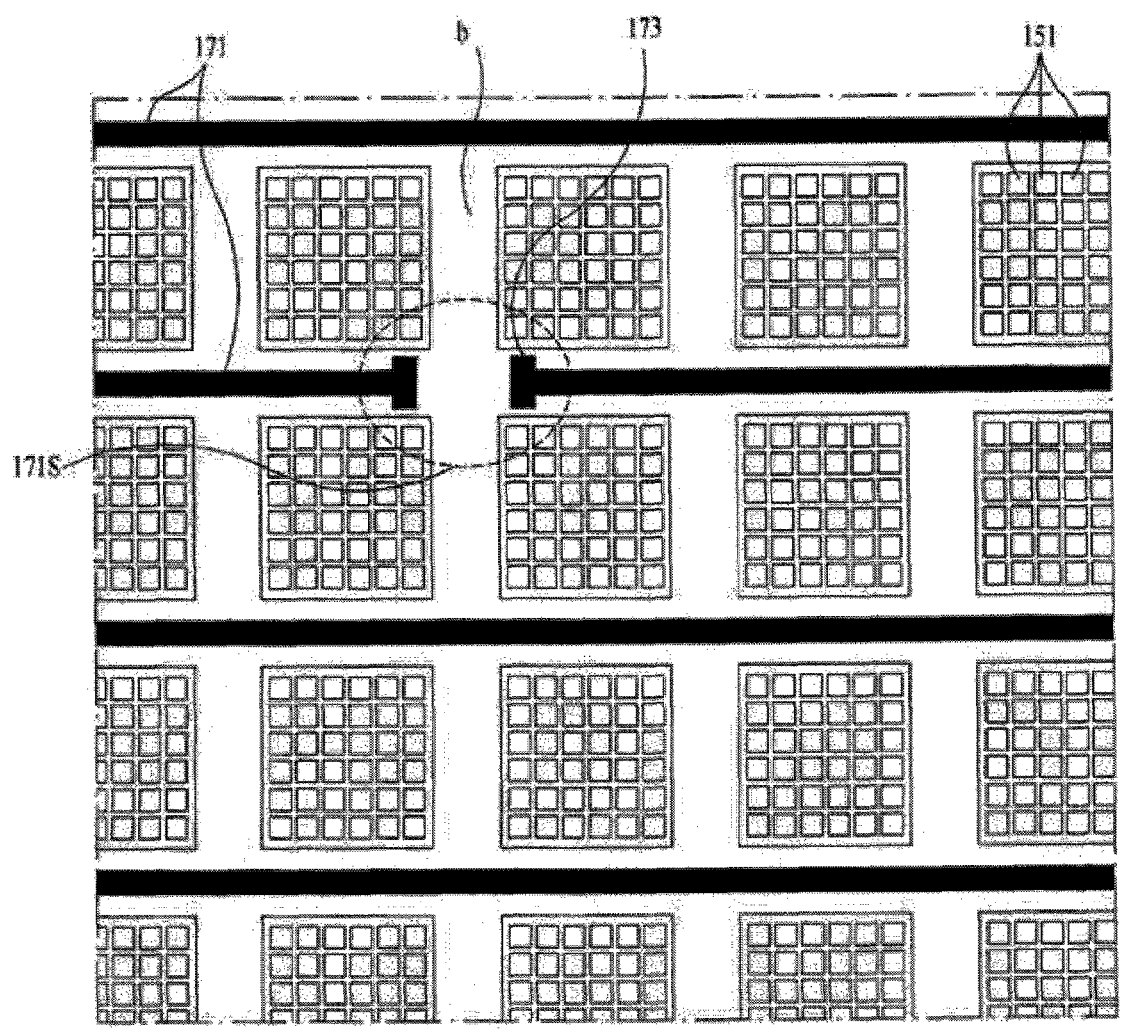

FIG. 1 is a sectional view taken along the line A-A of FIG. 4, which illustrates a semiconductor device according to embodiments. FIG. 2 is a plan view. In the drawings, the metal layers that protrude above a semiconductor substrate to form an interconnection and an interlayer dielectric layer of a low dielectric constant for insulating the metal layers from each other are selectively illustrated.

An interconnection lower metal layer 13 is formed over a semiconductor substrate 11. Although not shown in the drawing, the lower metal layer 13 has a geometric pattern. The lower metal layer 13 is formed of a layer selected among the group consisting of an Al layer, an Al—Cu alloy layer, a Cu layer, a W layer, a Pt layer, an Au layer, a Ti layer, a TiN layer, and a TiW layer.

An interlayer dielectric layer 15 is formed over the lower metal layer 13. The interlayer dielectric layer 15 is etched through an etching process using a photoresist pattern to form vias 151 through which the lower metal layer is exposed. As illustrated in FIG. 1, the vias 151 formed in the interlayer dielectric layer 15 are highly integrated.

Figure 3:
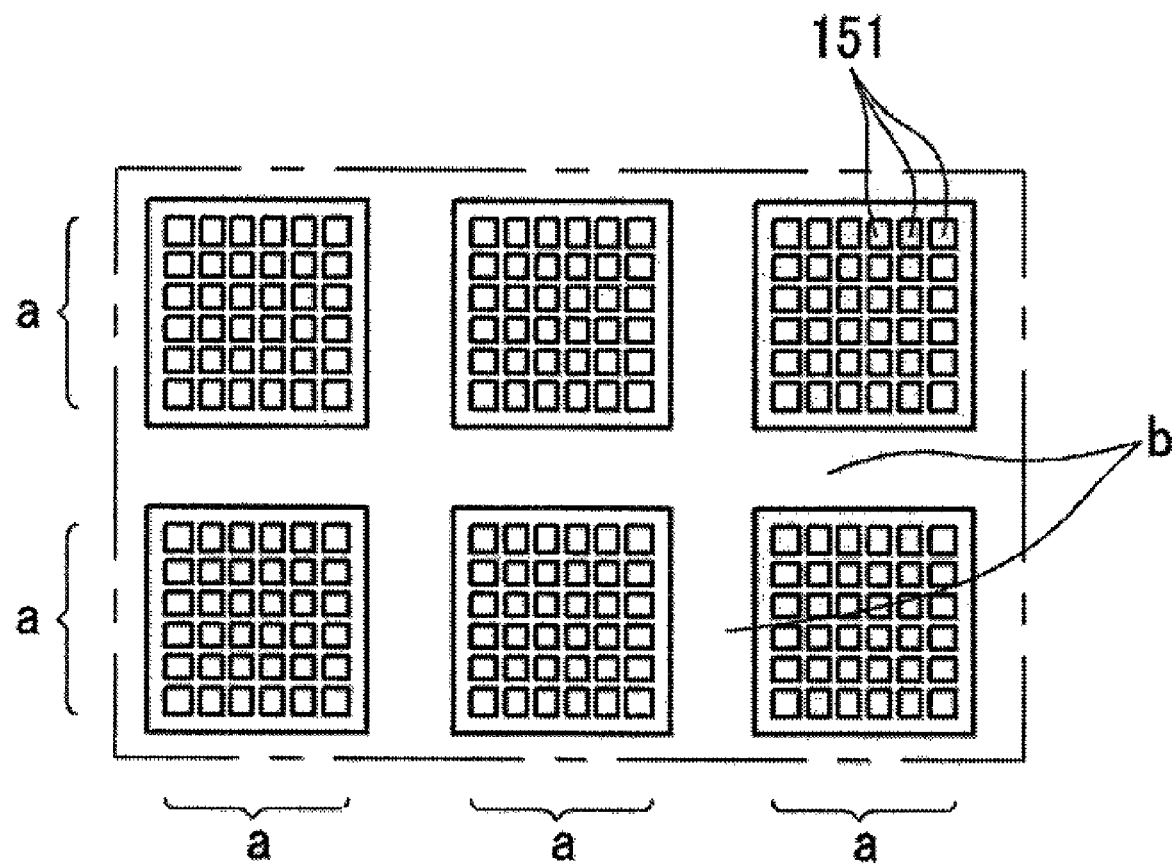
FIG. 3 illustrates via patterns formed in an interlayer dielectric layer; and Example FIG. 4 simultaneously illustrates slit patterns and via patterns.

In FIG. 3, via patterns 15V formed in the interlayer dielectric layer 15 are illustrated. As illustrated in FIG. 3, the via patterns 15V resemble a group of baduk boards or checker boards. The via patterns 15V include pattern units in the shape of a group of baduk boards and line units b that separate the pattern units from each other to make boundaries.

The line unit has a predetermined width and is extended in the horizontal and vertical directions in plan view. Therefore, the interlayer dielectric layer 15 is partitioned to be latticed. In the parts partitioned off by the line units b, the patterns a are densely formed in the form of baduk boards or square matrices. In the drawing, the patterns a are the group of vias 151 in a 6×6 matrix.

An upper metal layer 17 is formed over the interlayer dielectric layer 15 having such via patterns. The upper metal layer 17 is connected to the lower metal layer 13 through the via patterns 15V. The upper metal layer 17 can be formed of a layer selected from the group consisting of an Al layer, an Al—Cu alloy layer, a Cu layer, a W layer, a Pt layer, an Au layer, a Ti layer, a TiN layer, and a TiW layer and may forms a power interconnection connected to a power source.

FIG. 4 illustrates slit patterns 171S formed in the upper metal layer 17. In the drawing, in order to show position relationship between the vias and the slits, the via patterns 151V and the slit patterns 171S are illustrated together.

As illustrated in FIG. 4, the slits 171 that constitute the slit patterns 171S form a vertical stream. The slits 171 are positioned immediately above the line units b of the via patterns 151V where the vias are not formed in comparison with the via patterns 151V.

As described above, the slits 171 formed in the upper metal layer 17 expose parts of the interlayer dielectric layer 15 to buffer the stress applied to the upper metal layer 17 due to the vias 151 that are highly integrated in the thermal process. That is, the stress generated by the pattern units a of the interlayer dielectric layer 15 during the thermal process is transmitted to the upper metal layer 17. The slit patterns 171S formed in the upper metal layer 17 transmit the stress transmitted to the upper metal layer 17 through the slits to prevent the upper metal layer or the interlayer dielectric layer form being damaged.

Extension units 173 that extend the exposure parts of the slit 171 may be formed on both ends of the slit 171. The extension units 173 increase the volume of the slit 171 so that the stress transmitted to both ends of the slit 171 can be sufficiently absorbed.

The extension units 173 can be square in plan view as illustrated in FIG. 2 or they can be circular.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

According to embodiments, when the highly integrated via pattern is formed in the interlayer dielectric layer, the stress transmitted to the upper metal layer formed over the interlayer dielectric layer is buffered through slits to reduce defects caused by the stress.

What is claimed is:

1. A semiconductor device comprising:
   a first metal layer over a semiconductor substrate;
   an interlayer dielectric layer having a relatively low dielectric constant formed over the first metal layer;
   via patterns formed in the interlayer dielectric layer;
   a second metal layer formed over the interlayer dielectric layer having the relatively low dielectric constant; and
   slit patterns formed in the second metal layer and exposing predetermined regions of the interlayer dielectric layer where the via patterns are not formed, wherein extension units are formed at an end of a slit that constitutes a slit patterns,
   wherein the via patterns are grouped in a form of a square matrix.

2. The semiconductor device of claim 1, wherein the extension units are formed at both ends of the slit, respectively.

3. The semiconductor device of claim 1, wherein the extension units have circular shapes when viewed in a plan view.

4. The semiconductor device of claim 1, wherein the slits are positioned between groups of the via patterns.

5. The semiconductor device of claim 1, wherein the second metal layer is an interconnection connected to a power source.

6. The semiconductor device of claim 1, wherein the extension units have square shapes when viewed in a plan view.

7. A method of manufacturing a semiconductor device, the method comprising the steps of:
   forming a first metal layer over a semiconductor substrate;
   forming an interlayer dielectric layer having a relatively low dielectric constant over the first metal layer;
   forming via patterns in the interlayer dielectric layer;
   forming a second metal layer over the interlayer dielectric layer; and
   forming slit patterns including extension units at ends thereof in the second metal layer and exposing predetermined regions of the interlayer dielectric layer where the via patterns are not formed,
   wherein the via patterns are grouped in a form of a sguare matrix.

8. The method of claim 7, wherein the extension units are formed at both ends of the slit.

9. The method of claim 7, wherein the extension units have circular shapes when views in a plan view.

10. The method of claim 7, wherein the slits are positioned between groups of the via patterns.

11. The method of claim 7, wherein the extension units have square shapes when viewed in a plan view.

* * * * *